United States Patent
Hofmeister

[11] Patent Number: 6,139,245
[45] Date of Patent: *Oct. 31, 2000

[54] ROBOT ARM RELOCATION SYSTEM

[75] Inventor: Christopher A. Hofmeister, Hampstead, N.H.

[73] Assignee: Brooks Automation Inc., Chelmsford, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/891,523

[22] Filed: Jul. 11, 1997

[51] Int. Cl.$^7$ ........................................... B25J 9/12
[52] U.S. Cl. ................. 414/416; 74/89.21; 74/490.04; 74/490.09; 414/935; 414/937
[58] Field of Search ................................ 414/416, 935, 414/937; 74/89.2, 89.21, 89.22, 490.04, 490.09; 212/321; 104/173.1

[56] References Cited

U.S. PATENT DOCUMENTS

| | | | |
|---|---|---|---|
| 1,633,920 | 6/1927 | Bradford | 212/321 |
| 4,599,032 | 7/1986 | Haus | 212/321 |
| 4,714,400 | 12/1987 | Barnett et al. | 901/24 |
| 4,715,921 | 12/1987 | Maher et al. | 156/345 |
| 4,721,005 | 1/1988 | Yoshiji et al. | 74/490.04 |
| 4,778,331 | 10/1988 | Kimata et al. | 414/661 |
| 4,846,619 | 7/1989 | Crabtree et al. | 414/273 |
| 4,903,536 | 2/1990 | Salisbury, Jr. et al. | 74/89.22 |
| 4,923,584 | 5/1990 | Bramhall, Jr. et al. | 204/298.25 |
| 5,046,375 | 9/1991 | Salisbury, Jr. et al. | 74/89.22 |
| 5,177,514 | 1/1993 | Ushijima et al. | 414/937 |
| 5,198,736 | 3/1993 | Azuma et al. | 74/89.22 |
| 5,388,480 | 2/1995 | Townsend | 74/501.5 |
| 5,512,320 | 4/1996 | Turner et al. | 427/255 |
| 5,711,646 | 1/1998 | Ueda et al. | 414/937 |
| 5,784,799 | 7/1998 | Kato et al. | 34/92 |
| 5,804,932 | 9/1998 | Yanagisawa | 74/89.22 |

FOREIGN PATENT DOCUMENTS

| | | | |
|---|---|---|---|
| 892056 | 10/1981 | U.S.S.R. | 74/89.22 |
| 901044 | 1/1982 | U.S.S.R. | 901/21 |

Primary Examiner—Thomas J. Brahan
Attorney, Agent, or Firm—Perman & Green, LLP

[57] ABSTRACT

An apparatus for moving substrates into and out of a substrate processing device. The apparatus has a frame and a substrate transport. The frame is adapted to be connected to the substrate processing device and can removably receive substrate cassettes. The substrate transport is movably mounted to the frame. The substrate transport has a track movement mechanism and a movable robot arm assembly mounted to the track movement mechanism. The track movement mechanism includes a housing, two pulley spindles rotatably connected to the housing, a drive motor connected to one of the pulley spindles, and flexible connecting elements connected to the frame and looped in a general S shape around the two pulley spindles.

26 Claims, 7 Drawing Sheets

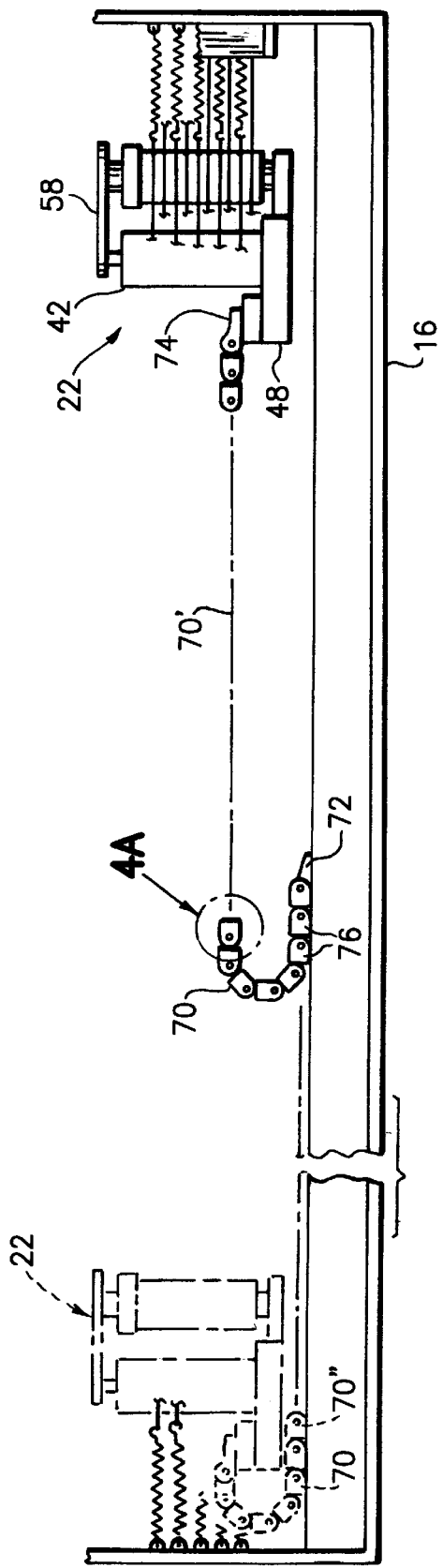

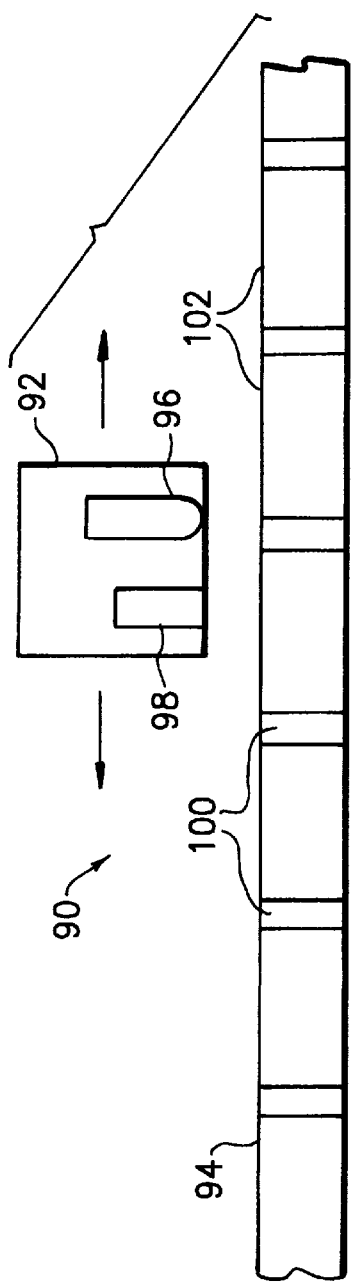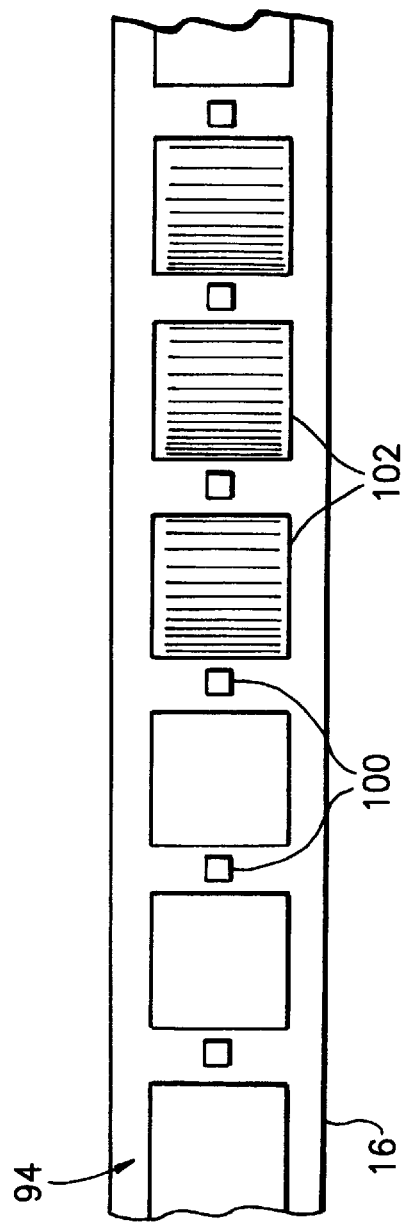

ROBOT ARM RELOCATION SYSTEM

BACKGROUND OF THE INVENTION

1. Field of the Invention

The present invention relates to a system for moving substrates into and out of a substrate processing device and, more particularly, to robot arm relocation system.

2. Prior Art

Various types of robot arms are known in the prior art for moving substrates from substrate cassettes into a substrate processing device and, returning the substrates back to the cassettes. Various types of drive systems that use flexible connecting elements are also known to exist.

SUMMARY OF THE INVENTION

In accordance with one embodiment of the present invention a robot arm relocation system is provided for relocating a robot arm to a desired position on a frame. The relocation system comprises a frame, a housing, two pulley spindles, a motor, and flexible connecting elements. The housing is adapted to have the robot arm mounted thereto. The housing is movably mounted on the frame. The two pulley spindles are rotatably connected to the housing. The motor is drivingly connected to a first one of the pulley spindles. The flexible connecting elements are connected to the frame and are looped in a general S shape around the two pulley spindles.

In accordance with another embodiment of the present invention an apparatus for moving substrates into and out of a substrate processing device is provided. The apparatus comprises a frame and a substrate transport. The frame has means for removably holding substrate cassettes on the frame and means for connecting the frame to the substrate processing device. The substrate transport comprises a movable robot arm assembly and a track movement mechanism. The track movement mechanism is movably mounted to the frame. The robot arm assembly is mounted to the track movement mechanism. Flexible connection elements are connected between opposite ends of the frame. A drive pulley of the track movement mechanism has the flexible connection elements at least partially wound thereon.

In accordance with another embodiment of the present invention a system for moving substrates between substrate cassettes and a substrate processing device is provided. The system comprises a robot arm assembly, a movable track car, and flexible connection elements. The movable track car has the robot arm assembly mounted thereon. The track car has two rotatable pulley spindles and means for rotating at least one of the pulley spindles. The flexible connection members are wound, at least partially, around the two pulley spindles. The at least one pulley spindle is rotated to move the track car along the flexible connection members and position the robot arm assembly for substantially straight removal and insertion of substrates from and into the substrate cassettes and the substrate processing device.

BRIEF DESCRIPTION OF THE DRAWINGS

The foregoing aspects and other features of the present invention are explained in the following description, taken in connection with the accompanying drawings, wherein:

FIG. 4 is a schematic partial front elevational view of the frame, drive, and electrical conductor support of the apparatus shown in FIG. 1;

FIG. 5A is a schematic partial front elevational view of the position signaling system used in the apparatus shown in FIG. 1;

FIG. 5B is a partial top plan view of the stationary section of the position signaling system shown in FIG. 5A.

DETAILED DESCRIPTION OF THE PREFERRED EMBODIMENT

Figure 1:
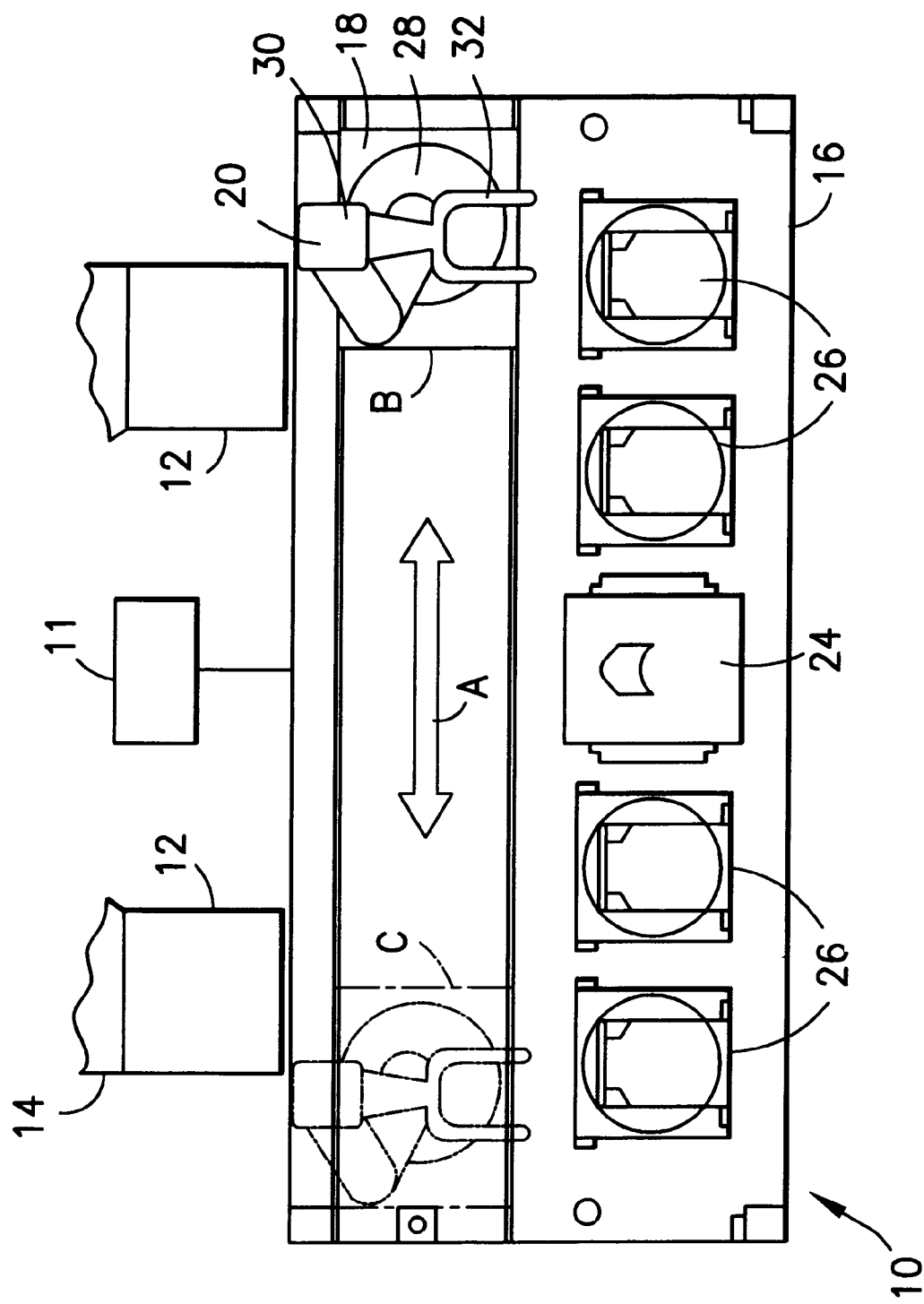
FIG. 1 is a schematic top plan view of an apparatus incorporating features of the present invention for moving substrates into and out of a substrate processing device.

Referring to FIG. 1, there is shown an exploded perspective view of a an apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The apparatus 10 is shown connected to load locks 12 of a substrate processing device 14. The device 14 is adapted to process substrates, such as semiconductor wafers or flat panel displays, as is known in the art. Examples of substrate processing devices are described in U.S. Pat. Nos. 4,715,921 and 5,512,320 which are hereby incorporated by reference in their entireties. In alternate embodiments, the apparatus 10 could be configured to work with any suitable type of substrate processing apparatus. The apparatus 10 generally comprises a frame 16, a car 18, a robot 20, a drive 22 (see FIG. 2), an aligner 24, and means for removably holding substrate cassettes 26. The apparatus 10 serves the function of removing substrates from the cassettes 26 and inserting them into the substrate processing device 14 at the load locks 12. Once the substrate processing device 14 is finished processing a substrate, the apparatus 10 is used to return the substrate from one of the load locks 12 back to one of the cassettes 26. An operator can remove a cassette 26 after it has been filled with processed substrates and insert a new cassette of unprocessed substrates in its place. The apparatus 10 can be adapted to hold any suitable member of cassettes 26. Preferably, the apparatus operates in atmospheric pressure, but could be used in other pressure situations, such as in a vacuum. The aligner 24 is used to align the substrates as is well known in the art. In an alternate embodiment, the apparatus 10 need not have an aligner, such as when the aligner is located in the substrate processing device 14. The apparatus 10 might also have a substrate buffer. The apparatus 10 is connected to a computer controller 11 which controls movement of the car 18 relative to the frame 16 and controls the robot 20.

The robot 20 generally comprises a drive section 28, a movable arm 30, and an end effector 32. The end effector 32 is adapted to hold substrates therein. The end effector 32 is attached to an end of the arm 30. The drive section 28 is adapted to move the arm 30 to thereby move the end effector 32 into and out of the cassettes 26, aligner 24, and load locks 12. In alternate embodiments, any suitable type of robot could be used. The robot 20 is mounted to the car 18. The car 18 is movably mounted to the frame 16. The car 18 can move along the frame 16 as indicated by arrow A between position B and position C.

Figure 2:
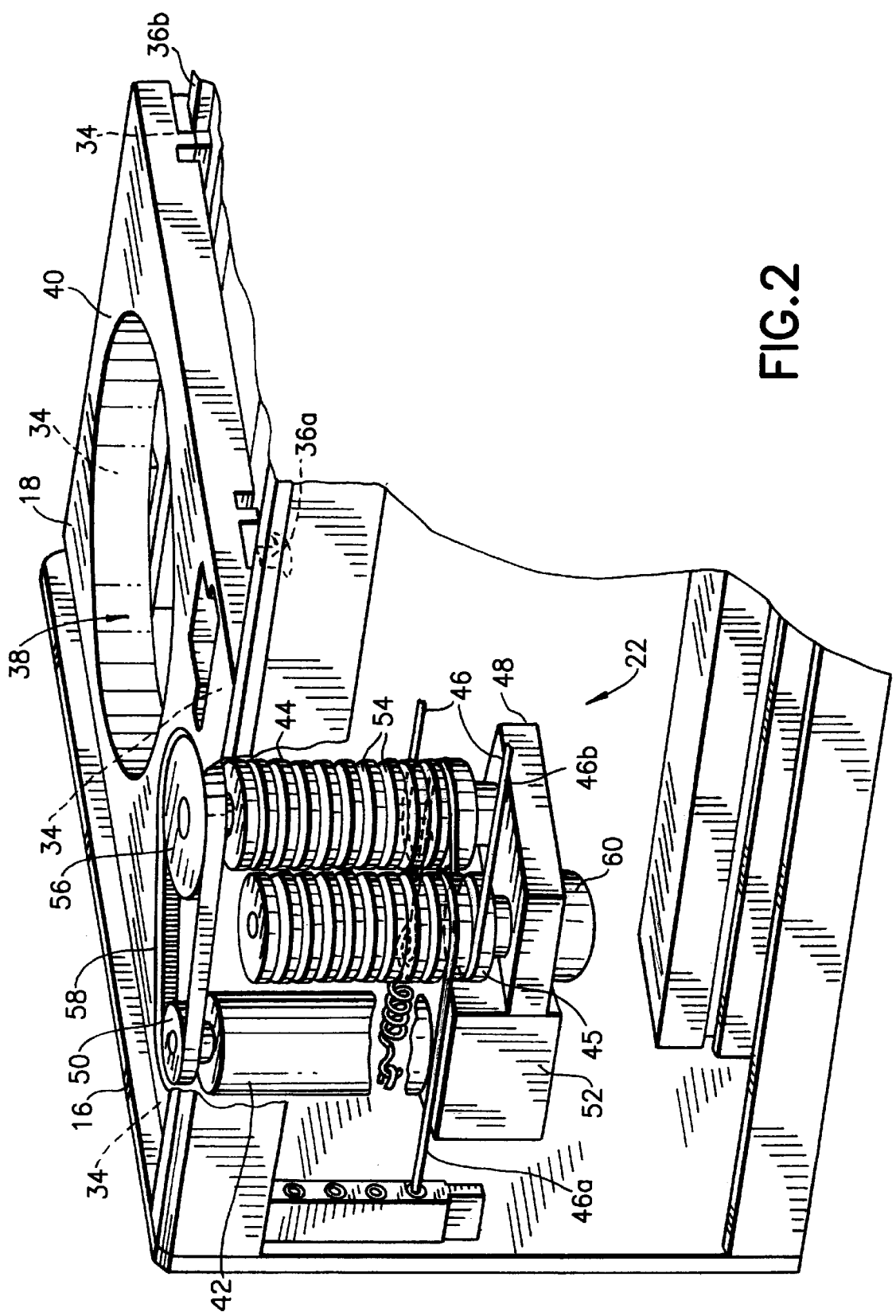
FIG. 2 is a partial broken-away perspective view of the apparatus shown in FIG. 1.

Referring also to FIG. 2, the car 18 forms a mounting housing for mounting the robot 20 to the frame 16 as a shuttle or track movement system. The car 18 has bearings or wheels 34. The frame 16 has front and rear track sections 36a, 36b. The bearings 34 and track sections 36, similar to a railroad track system, allow the car 18 to move along the frame 16 along a predetermined confined path. In an alternate embodiment, a multi-section track system could be used with switches or turnouts. The car 18 has a center hole 38 for receiving the drive section 28 of the robot 20 therein. A mounting flange of the robot 20 is located on top of the top surface 40 of the car 18 and fixed thereto, such as by screws. Thus, preferably, the robot 20 is mounted to the car 18 by merely placing the robot in the hole 38 as a drop-in assembly. This may also make maintenance and repair of the robot easier. In alternate embodiments, any suitable type of track system or system for movably supporting the car along the frame could be used. The robot could also be connected to the car in any suitable fashion.

The drive 22 for the apparatus 10 is adapted to move the car 18 along the frame 16. The drive 22 includes a motor 42, two pulley spindles 44, 45 and flexible connecting elements 46. The car 18 includes a support section 48. The motor 42 and two spindles 44, 45 are mounted at their tops to the car 18 near the top surface 40 and at their bottoms to the support section 48 which extends down from the top of the car 18. The motor 42 is a computer controlled electric motor with a driving pulley 50 at its top. Mounted at the bottom of the motor 42 is a position encoder 52. The encoder 52 is used to determine the position of the car 18 on the frame 16. Any suitable type of motor encoder could be used or, alternatively, the motor 42 need not have an encoder. The two pulley spindles 44, 45 are mounted side-by-side from front to back of the frame 16 (see FIG. 3A). Each spindle is axially rotatably mounted to the car 18 and include circumferential grooves 54. The first pulley spindle 44 is a drive section for the flexible connecting elements 46. The spindle 44 includes a driven pulley 56 at its top. A transmission belt 58 connects the driving pulley 50 to the driven pulley 56. Thus, rotation of the driving pulley 50 by the motor 42 moves the belt 58 to rotate the driven pulley 56 and thereby axially rotate the drive pulley spindle 44. In an alternate embodiment, any suitable drive system to rotate the drive pulley spindle 44 could be used. The second pulley spindle 45 is a support that cooperates with the drive pulley 44 for interaction with the flexible connecting members 46. In this embodiment, a computer controlled brake 60 is connected to the second pulley spindle 45. However, in an alternate embodiment, a brake need not be used.

Figure 3A:
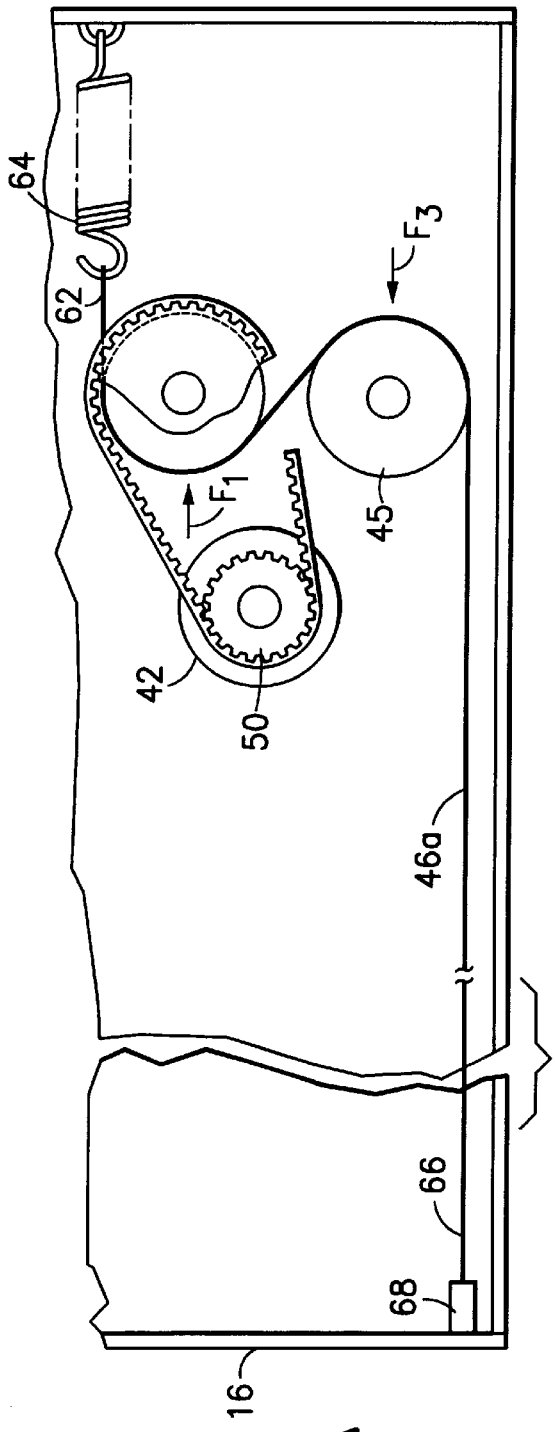
FIG. 3A is a schematic partial top view of the frame, pulley spindles, motor and a flexible connecting element of a first set of the elements.
Figure 3B:
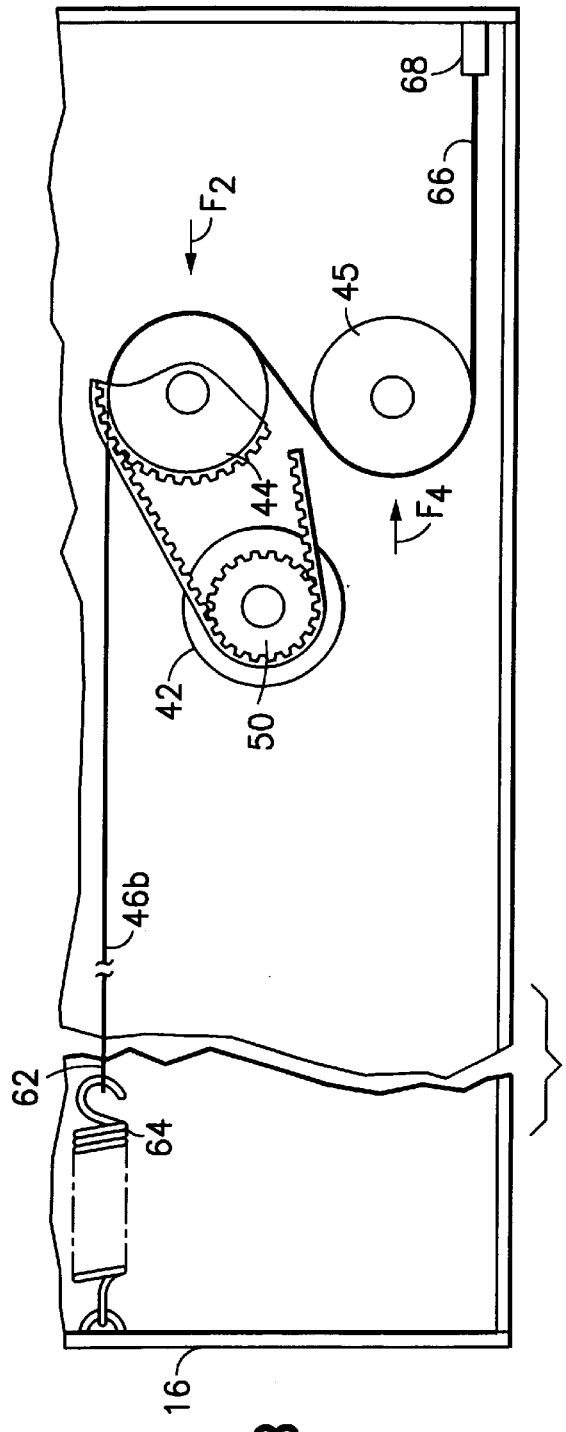
FIG. 3B is a schematic partial top view as in FIG. 3A showing a flexible connecting element of a second set of the elements.

The flexible connecting elements 46 are grouped into two sets; a first set 46a and a second set 46b. There are preferably multiple elements 46 in each set, such as five to eight in each set. However, any suitable member of elements 46 could be used. The number of elements 46 is preferably selected based upon the weight of the robot 20, car 18, drive 22, and substrate(s) to be carried to minimize slippage of the pulley spindles 44, 45 relative to the elements 46. The elements 46 are wrapped around the pulley spindles 44, 45 in the grooves 54. Referring also to FIGS. 3A and 3H, each element has two ends that are connected to the frame 16. A first end 62 of each element 46 is connected to the frame 16 by a spring 64. A second end 66 of each element 46 is connected to the frame 16 by a stationary mount 68. The elements 46 are preferably made of metal as wires or cables. For the first set 46a, the springs 64 are connected to the right side of the frame 16 and the mounts 68 are connected to the left side of the frame. For the second set 46b, the springs 64 are connected to the left side of the frame and the mounts 68 are connected to the right side of the frame. As seen from the schematic top views of FIGS. 3A and 3B, looking from the front, the first set of elements 46a are wrapped around the two pulley spindles 44, 45 in a general S shape. The second set of elements 46b, on the other hand, are wrapped around the two pulley spindles 44, 45 in a general reverse S shape. Preferably, the two sets 46a, 46b are interleaved in alternating fashion along the height of the pulley spindles 44, 45. With the interleaved and alternating wraps of the elements 46 on the spindles 44, 45, net forces exerted by the elements 46 on the spindles 44, 45 substantially offset each other. For example, force $F_1$ substantially offsets force $F_2$. Likewise, force $F_3$ substantially offsets force $F_4$. Thus, the bearings which rotatably supporting the spindles 44, 45 on the car 18 can be relatively small. In alternate embodiments, other types of pulley spindles and flexible connecting element arrangements or configurations could be provided.

When the drive motor 42 rotates the drive pulley 44, frictional forces between the drive pulley 44 and the flexible elements 46 cause the car 18 to move along the frame 16. The springs 64 keep tension on the elements 46. The brake 60 helps to precisely stop the car 18 at a desired location. The encoder 52 helps to signal the location of the car 18 on the frame 16 to the control computer based upon rotations and position of the motor 42.

Figure 4A:
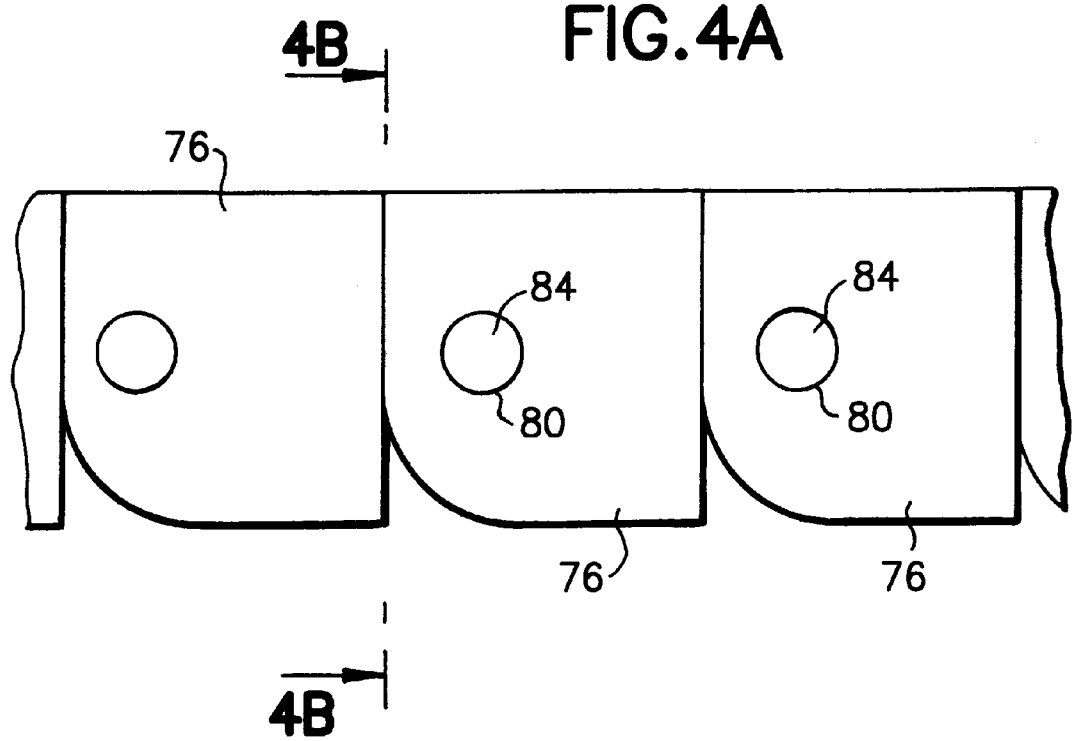
FIG. 4A is an enlarged view of the area 4A shown in FIG. 4.
Figure 4B:
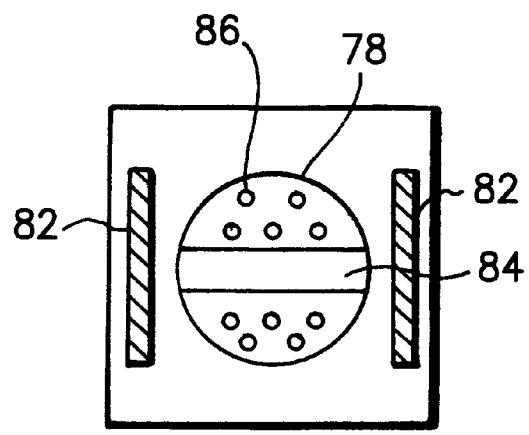
FIG. 4B is a sectional view taken along line 4B—4B of FIG. 4A.

Referring also to FIG. 4, a schematic front elevational view of the frame 16 and drive 22 is shown. The drive 22 is shown at the right side of the frame 16. Connected between the frame 16 and the support section 48 is a chain 70. The chain 70 has a first end 72 fixedly mounted to the frame 16 and a second end 74 fixedly mounted to the support section 48. The chain 70 has a plurality of links 76 pivotably connected to each other. Referring also to FIGS. 4A and 4B, the links 76 each have a center channel 78, a transverse pin channel 80, and two rearward extending arms 82. The arms 82 each have a pin hole that are aligned with the pin channel 80 of the adjacent rear link. Pins 84 pivotably mount the links 76 together at the pin holes and channels 80. The rear of each link 76 is flat. The top front of each link 76 is flat and the bottom front is curved. Thus, the links 76 can curve in only one direction. This allows the chain 70 to remain substantially straight when elevated off of the frame 16 at the area 70'. In alternate embodiments, other means could be used to support the area 70'. Located in the center channels 78 are electrical wires 86. The wires 86 electrically connect the motor 42, encoder 52, and brake 60 to the computer controller 11. The chain 70 forms a reconfigurable support for the wires 86. As shown in dotted lines in FIG. 4, when the drive 22 is moved to the left side of the frame 16, the majority of the chain 70" rolls down on the frame 16. When the drive 22 moves back to the right, the chain rolls up again. Thus, the wires 86 are safety supported in the chain for movement with the drive 22 as the drive is moved. In alternate embodiments, other types of means to provide an electrical power and signal connection to the drive could be provided.

Referring also to FIGS. 5A and 5B, a position signaling system 90 of the apparatus 10 is shown. The system 90 is used to signal the location of the car 18 relative to the frame 16. The system 90 includes a movable block 92 mounted to the support section 48 of the car 18 and a stationary array 94 mounted to the frame 16. The movable block 92 includes a light 96 and an optical sensor 98. The stationary array 94 includes optical detectors 100 and gradient sections 102. The movable block 92 moves back and forth over the top surface of the array 94 as the car 18 is moved. Because of the long length of the frame 16, the system 90 is a two step system. The detectors 100 are alternatingly arranged with the gradient sections 102. The first part of the system is a rough or course positioning system which uses the light 96 and the optical detectors 100. As the block 92 moves over the array 94, light from the light 96 is detected by the individual detectors 100. This gives a course location of where the block 92 is located relative to the frame 16. The second part of the system is a fine positioning system which uses the optical sensor 98 and the gradient sections 102. The gradient sections 102 have gradient markings. The optical sensor 98 is adapted to read these markings immediately below the sensor 98. The computer controller uses the outputs from the optical detectors 100 and optical sensor 98 to determine the position of the car 18 relative to the frame 16. Preferably, the system 90 is used in conjunction with the motor encoder 52 to properly move the car 18 relative to frame 16. In alternate embodiments, any suitable type of relative position signaling or sensing system could be used.

Figure 6:
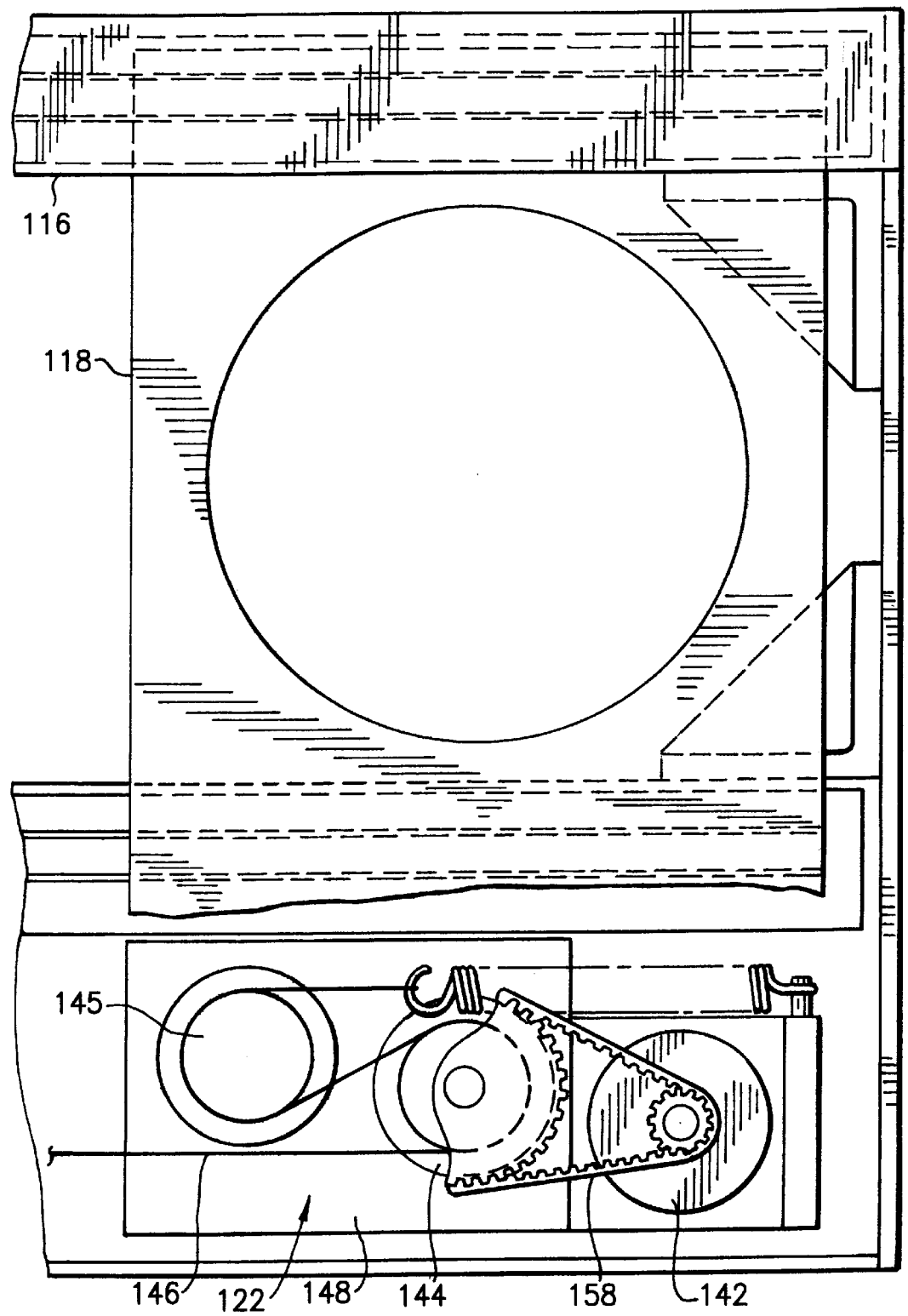
FIG. 6 is a partial schematic top view of an alternate embodiment.

Referring now to FIG. 6, an alternate embodiment of the invention is shown. The car 118 is movably mounted to the frame 116 and the drive 122 is mounted to the support section 148 of the car 118. The two pulley spindles 144, 145 are mounted to the car 18 as shown as a left side pulley spindle 145 and a right side pulley spindle 144. The motor 142 is connected to the drive pulley spindle 144 by a transmission belt 158. The flexible members 146 are all wrapped around the spindles 144, 145 in the same direction. This type of arrangement can be more compact than that shown in FIGS. 2, 3A and 3B, but requires larger bearings to withstand the larger forces on the spindles 144, 145 exerted by the flexible members 146.

It should be understood that the foregoing description is only illustrative of the invention. Various alternatives and modifications can be devised by those skilled in the art without departing from the invention. Accordingly, the present invention as intended to embrace all such alternatives, modifications and variances which fall within the scope of the appended claims.

What is claimed is:

1. A robot arm relocation system for relocating: a robot arm to a desired position on a frame, the relocation system comprising:
   a frame;
   a housing having a robot mounting section adapted to have the robot arm connected thereto, the housing being movably mounted on the frame;
   two pulley spindles rotatably connected to the housing;
   a motor drivingly connected to a first one of the pulley spindles; and
   two sets of flexible connecting elements connected to the frame and looped in a general S shape around the two pulley spindles, wherein the two sets each comprise multiple ones of the flexible connecting elements, wherein one end of each flexible connecting element is connected to the frame by a spring, and wherein the one end is a first end of the elements for a first one of the sets connected by their respective springs to the frame at a first location and the one end is a first end of the elements for a second one of the sets connected by their respective springs to the frame at a second different location spaced from the first location.

2. A system as in claim 1 wherein a second one of the pulley spindles has a brake connected thereto.

3. A system as in claim 1 wherein the two pulley spindles are located in a line perpendicular to movement of the housing on the frame.

4. A system as in claim 3 wherein the two sets of elements are looped around the two pulley spindles in different respective directions.

5. A system as in claim 1 wherein the flexible connecting elements of the first and second sets are alternatingly interleaved.

6. A system as in claim 1 further comprising a motor encoder.

7. A system as in claim 1 further comprising a location sensor between the frame and the housing for sensing the location of the housing on the frame.

8. A system as in claim 7 wherein the location sensor includes an optical grating on the frame and optical sensors.

9. A system as in claim 7 further comprising a motor encoder.

10. A system as in claim 1 further comprising a chain connected between the frame and the housing, the chain providing a movable structural support for electrical wires connected to the electrical components on the housing, the chain moving in a predetermined path as the housing is moved on the frame.

11. A system as in claim 1 wherein the robot mounting section comprises a car with wheels, and wherein the car comprises a robot drive section receiving hole through a top surface of the car.

12. A system as in claim 1 further comprising a location sensing system for sensing a position of the housing on the frame, the location sensing system comprising a first course position sensor and an independent second fine position sensor.

13. An apparatus for moving substrates into and out of a substrate processing device, the apparatus comprising:
   a frame having means for removably holding substrate cassettes on the frame and means for connecting the frame to the substrate processing device;
   a substrate transport comprising a movable robot arm assembly and a track movement mechanism, the track movement mechanism being movably mounted to the frame, and the robot arm assembly being mounted to the track movement mechanism; and
   a location sensing system for sensing a position of a portion of the track movement mechanism relative to the frame, the location sensing system comprising a first course position sensor and a second fine position sensor,
   wherein flexible connection elements are connected between opposite ends of the frame, and a drive pulley of the track movement mechanism has the flexible connection elements at least partially wound thereon, and wherein the second sensor comprises an optical sensor on the track movement mechanism and a plurality of stationary sections on the frame, each section having multiple gradation markings with different spacings between the markings in each section.

14. An apparatus as in claim 13 wherein the substrate transport further comprises a second pulley next to the drive pulley with the flexible connection elements looped around the two pulleys in a general S shape.

15. An apparatus as in claim 14 wherein the second pulley has a brake connected thereto.

16. An apparatus as in claim 14 wherein the two pulleys are located in a line perpendicular to movement of the substrate transport on the frame.

17. An apparatus as in claim 16 wherein the flexible connecting elements comprise two sets of elements looped around the two pulleys in different directions.

18. An apparatus as in claim 13 wherein one end of each flexible connecting element is connected to the frame by a spring.

19. An apparatus as in claim 18 wherein the one end is a first end of the elements for a first set of the elements and the one end is an opposite second end of the elements for a second set of the elements.

20. An apparatus as in claim 19 wherein the flexible connecting elements of the first and second sets are alternatingly interleaved.

21. An apparatus as in claim 13 further comprising a motor encoder on a drive motor connected to the drive pulley.

22. An apparatus as in claim 13 wherein the second sensor includes an optical grating on the frame and an optical sensor.

23. An apparatus as in claim 22 further comprising a motor encoder on a drive motor connected to the drive pulley.

24. An apparatus as in claim 13 further comprising a chain connected between the frame and the substrate transport, the chain providing a movable structural support for electrical wires connected to electrical components on the substrate transport, the chain moving in a predetermined path as the track movement mechanism is moved on the frame.

25. A system as in claim 13 wherein the first sensor comprises detectors stationarily connected to the frame.

26. A substrate moving system for moving substrates between substrate cassettes and a substrate processing device, the system comprising:

a robot arm assembly comprising a substrate holder;

a movable track car having the robot arm assembly mounted thereon, the track car having two rotatable pulley spindles and a drive for rotating at least one of the pulley spindles;

a frame having the movable track car movably mounted thereon; and flexible connection members wound, at least partially, around the two pulley spindles, wherein the flexible connection members are arranged as at least two sets, each set having multiple ones of the flexible connection members, a first one of the sets having first ends of its members connected to a first location of the frame by a first set of springs and opposite second ends of its members connected to a second location of the frame without springs, and a second one of the sets having second ends of its members connected to the first location of the frame without springs and opposite first ends of its members connected to the second location of the frame by a second set of springs, wherein the at least one pulley spindle is rotated by the drive to move the track car along the flexible connection members and position the robot arm assembly relative to the frame.

* * * * *